United States Patent [19]

Abe et al.

[11] Patent Number: 4,821,946

[45] Date of Patent: Apr. 18, 1989

[54] SOLDERING METHOD

[75] Inventors: Seiichi Abe; Kenji Fujita, both of Odawara; Toshiyuki Nakao, Hadano, all of Japan

[73] Assignee: Hitachi, Ltd., Tokyo, Japan

[21] Appl. No.: 140,201

[22] Filed: Dec. 31, 1987

[30] Foreign Application Priority Data

Feb. 19, 1987 [JP] Japan ................................ 62-34620

[51] Int. Cl.[4] ................................................ B23K 1/02
[52] U.S. Cl. ................................ 228/180.2; 228/225; 228/248
[58] Field of Search ...................... 228/180.2, 139, 225, 228/248; 29/840

[56] References Cited

U.S. PATENT DOCUMENTS

| 3,451,122 | 6/1969 | Kuhns et al. | 29/843 |
| 3,465,422 | 9/1969 | Stenerson | 228/248 |

FOREIGN PATENT DOCUMENTS 54262  4/1980  Japan ................................ 228/248

*Primary Examiner*—Nicholas P. Godici
*Assistant Examiner*—Samuel M. Heinrich
*Attorney, Agent, or Firm*—Fay, Sharpe, Beall, Fagan, Minnich & McKee

[57] ABSTRACT

A soldering method of this invention has the steps of coating a plurality of lead terminals of an electronic component with connecting paste-like solders corresponding to lead terminals on conductive pads disposed on a substrate, holding the electronic component at the position separated from the corresponding paste-like solders at the lead terminals, and thereafter moving the substrate into a heating atmosphere furnace to melt the paste-like solder. In the melting step, the paste-like solders start melting when the temperatures of the pads arrive at the melting point of the solder and flow on the pads until contacting with the corresponding lead terminals. Thus, improper connection of the lead terminals to the pads due to smaller thermal capacity of the lead terminals than that of the substrate including the pads can be eliminated and productivity can be greatly improved.

8 Claims, 3 Drawing Sheets

SOLDERING METHOD

BACKGROUND OF THE INVENTION (a) Field of the Invention

This invention relates to a method for soldering a lead terminal of an electronic component to a terminal connecting portion on a printed substrate with a paste-like solder and, more particularly, to a soldering method adapted to connect an electronic component having a J-bend type or Butt-lead type lead terminal to a terminal connecting portion on a printed substrate with a paste-like solder.

(b) Description of Prior Art

A conventional method for soldering a lead terminal of an electronic component having a J type lead terminal on a terminal connecting portion of a printed substrate has, as shown in FIG. 1, the steps of placing paste-like solders 3, 3 on conductive pads 2, 2 formed as terminal connecting portions on a printed substrate 1, holding the lead terminals 5, 5 of an electronic component 4, such as an IC pack at the paste-like solders 3, 3 by means of the viscosity of the paste-like solders 3, 3, heating the substrate while moving the entire substrate, for example, by a belt conveyor (not shown) in a heating atmosphere furnace (not shown) to melt the paste-like solders 3, 3 to allow the melted paste-like solders 3, 3 to flow from the pads 2, 2 to lead terminals 5, 5 by means of a capillary phenomenon to connect them. Thus, the method for heating the entire substrate, for example, by moving the entire substrate by the belt conveyor in the heating atmosphere furnace is known as a vapor phase reflowing method or an infrared ray method.

In this conventional soldering method, the temperature rising rate of the pads 2 and the lead terminals 5 on the printed substrate 1 moving in the heating atmosphere furnace are slightly different due to the difference of the thermal capacities of the materials of the printed substrate 1 and the lead terminal of the electronic component 4, and the latter is, as shown in FIG. 3, generally larger than the former. This is because the substrate material is made of synthetic resin, such as epoxy resin while the material of the lead terminal 5 is made of solder-plated copper and solder-plated iron-nickel alloy. Thus, since the temperature of the pad 2 formed on the printed substrate 1 is very low when the lead terminal 5 of the electronic component 4 arrives at the melting point of the paste-like solder 3, part of the paste-like solder 3 contacted with the lead terminal 5 is melted earlier than the portion of the paste-like solder 3 contacted with the pad, and most of the melted solder is bonded, as shown in FIG. 2, in the state attracted to the lead terminal 5 to cause it to be improperly connected as its drawback. In order to reduce the difference of the above-mentioned temperature rising rates, it is tried to preheat the substrate, but it is difficult to suitably control the temperature in response to the external conditions, such as atmospheric temperature and moisture, a facility therefore is required, and the substrate might be damaged. Thus, a soldering method which has high efficiency of securing a number of electronic components at predetermined positions on a substrate without damaging the substrate is desired.

SUMMARY OF THE INVENTION

An object of this invention is to provide a soldering method which can eliminate the drawbacks of the above-mentioned conventional method and can reliably connect lead terminals of a number of electronic components at terminal connecting portions on a printed substrate.

Another object of this invention is to provide a soldering method adapted for an electronic part having a J type lead terminal or a butt lead terminal to obtain a preferable solder fillet without influence of the difference of the temperature rising rates of the terminal connecting portions on the substrate and the lead terminals of the electronic components.

These and other objects of the invention will be performed by a reading of the detailed description and the accompanying drawings.

BRIEF DESCRIPTION OF THE DRAWINGS

FIGS. 4 to 6 are views showing an embodiment of a soldering method according to the present invention; wherein FIG. 4 is a schematic plan view showing the layout of terminal connecting portions disposed on a substrate and a paste-like solder coated on each terminal connecting portion, FIG. 5 is a schematic explanatory view showing the state that electronic components are held, and FIG. 6 is a schematic explanatory view showing the connecting state of the lead terminal of the electronic component to the pad on the substrate;

DETAILED DESCRIPTION OF THE PREFERRED EMBODIMENTS

Figure 1:
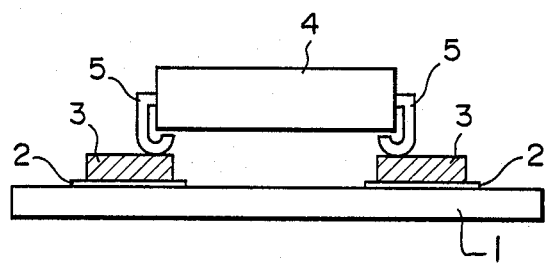
FIG. 1 is a schematic explanatory view for explaining an example of a conventional soldering method.
Figure 2:
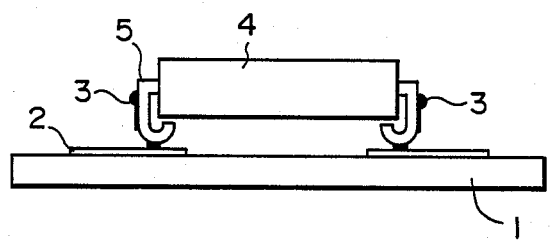
FIG. 2 is a schematic explanatory view for describing the improper connecting state formed by the soldering method in FIG. 1.
Figure 3:
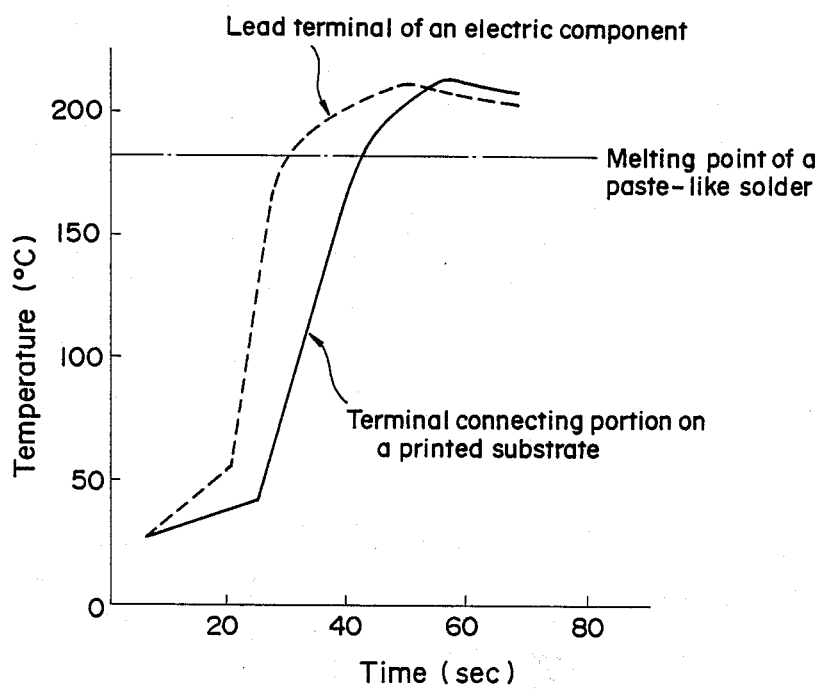
FIG. 3 is a view showing the relationship between the terminal connecting portions of the lead terminals of an electronic component on a substrate and temperature rising rates.
Figure 4:
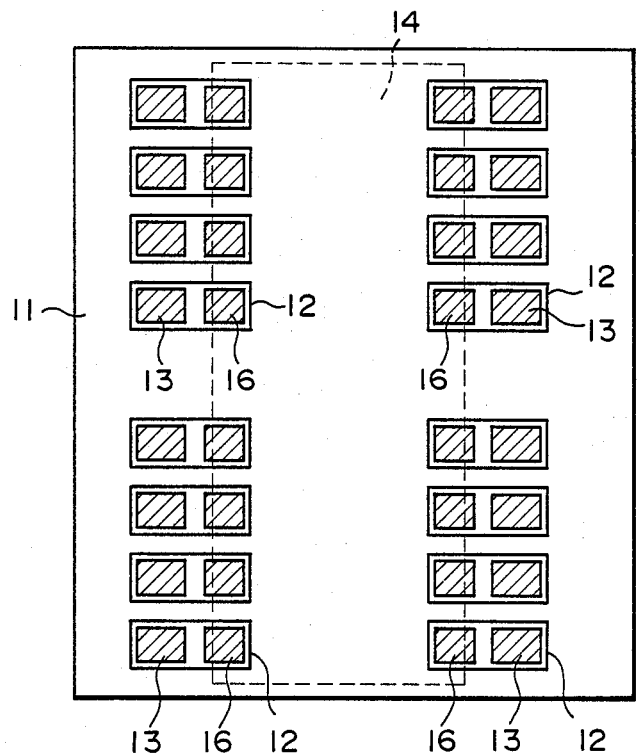
Figure 5:
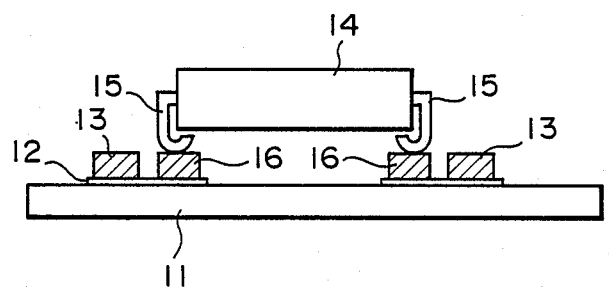
Figure 6:
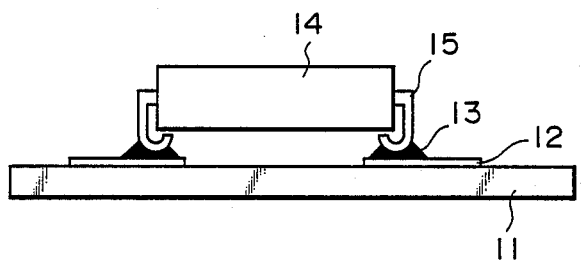

In FIG. 4, only one electronic component 14 (e.g., 1M DRAM) to be secured on a substrate 11 formed of an epoxy resin is shown. Eight J type lead terminals 15 made of solder-plated copper or solder-plated iron-nickel alloy are extended downward from each of two opposed sides of the electronic component 14. As shown in FIG. 5, the end of lead terminals 15 are bent in a round shape toward the inside. Reference numeral 12 designates pads formed on substrate 11 to receive lead terminals 15. Pads 12 are made of conductive material, such as copper in such a manner that the lead terminals 15 form connecting portions to be electrically connected. Paste-like solders 16, 16 are coated at positions separated from each other to receive the lower ends of the lead terminals 15, 15 projected from both sides of the electronic component 14 on adjacent pads 12, 12 in sidewise direction, and paste-like solders 13, 13 disposed at separate positions are coated spaced from the paste-like solders 16, 16 toward the outside. In this embodiment, the paste-like solder 13 is disposed to connect the lead terminal 15 to the pad 12 in case of melting. The paste-like solder 16 is to hold the lead terminals 15 as a retainer at a predetermined position as shown in FIG. 5 by means of the viscosity of the solder paste prior to the melting time, and also to connect the lead terminal 15 to the pad 12 together with the paste-like solder 13 at melting time. The paste-like solders 13, 16 are formed on the pads 12 by a known printing method, such as disclosed in Japanese unexamined patent publication No. 59-158585 published on Sept. 8, 1984. In the drawings, these paste-like solders 13 and 16 are shown in substantially the same size, however, it is sufficient for the paste-like solder 16 to have such a quantity that it can hold the lead terminal 15 at a predetermined position by means of its viscosity prior to melting time. The distance of the adjacent paste-like solders on the pads is set to a distance to join the adjacent paste-like solders 13 and 16 and cause them to flow on the pads in opposite directions during moving of the substrate 11 in a heating atmosphere furnace. The substrate 11 on which the paste-like solders 13 and 16 are coated is placed on a belt conveyor (not shown) to move toward the heating atmosphere furnace (not shown) in the next step in such a manner that the electronic components 14 coincide at the lead terminals 15, 15 thereof with the positions of the paste-like solders 16, 16 on the corresponding pads 12 on the substrate 11. The lead terminals 15 are held by the viscous forces in the state contacted with the above-mentioned paste-like solders 16 so as not be displaced during the movement of the belt conveyor. The substrate 11 is introduced in this state into a known heating atmosphere furnace, and may be introduced into a heating atmosphere furnace used in a vapor phase reflowing method or an infrared ray reflowing method. When the substrate 11 is introduced into the heating atmosphere furnace, the solders plated on the lead terminals 15 first start melting, and then the paste-like solders 16 in contact with the lead terminals 15 start melting. This is because the thermal capacity of the lead terminals 15 is smaller than that of the substrate 11 including the pads 12. At this time, part of the melted solders 16 rises from the lower end of the lead terminal 15 by means of capillary phenomenon to be adhere to the outer periphery of the lead terminal 15. Thereafter, when the temperature of the pad 12 arrives at the melting point of the solder, the paste-like solders 13 start melting to flow toward the paste-like solders 16 on the pads 12. When the melted solder 13 contacts with the previously melted solder 16, the melted solder 13 rises from the lower end of the lead terminal 15 to tend to form a fillet as shown in FIG. 6 by means of the surface tension together with the previously melted solder 16. At this time, the lead terminals 15 project symmetrically from both sides of one electronic component 14 and are supported by means of the surface tension of the melted solder to slightly displace them to an optimum balanced position of. More specifically, the lead terminals 15 are connected in self-aligning action by means of the surface tension of the melted solder. When the lead terminals 15 are first disposed on the corresponding paste-like solders 16, it is sufficient to contact the lower ends of the lead terminals 15 with parts of the paste-like solders 16, and it is understood that the accurate positioning is not necessary. Thereafter, when the entire substrate 11 is moved outside the heating atmosphere furnace and cooled, the melted solder is solidified, and the lead terminals 15 and the pads 12 are reliably electrically connected. In the embodiment described above, the viscosity of the paste-like solders 16 operate to hold the electronic components 14 so that the corresponding lead terminals 15 may not displace prior to melting time. The solders 16 are formed in the same print coating step as the paste-like solders 13 for substantially connecting the lead terminals 15 with the pads 12. Thus, it is not necessary to prepare a retainer for holding the electronic component 14 and the improper connection rate can be improved by a hundred times as compared with the conventional one to remarkably improve the productivity.

Figure 7:
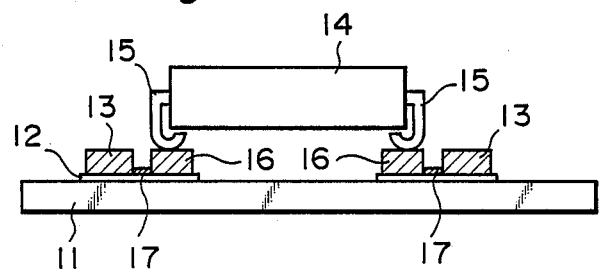
FIG. 7 is a schematic explanatory view showing a modified embodiment in which other paste-like solder to be connected between a pair of paste-like solders is disposed in the embodiment in FIG. 6.

In the embodiment as described above, a pair of paste-like solders 13 and 16 are coated on the position separated from each other on the pads. As shown in FIG. 7, the pair of paste-like solders 13 and 16 are disposed, and other paste-like solders 17 for connecting them can be disposed. These steps of print coating the paste-like solders are performed actually by print coating each of the pads with a large paste-like solder region, and then separating the large region into the paste-like solder 13, the paste-like solder 16 and the paste-like solder 17 of thinner and smaller area than the paste-like solders 13 and 16. The paste-like solder 17 is so selected in size and thickness as to thermally separate the paste-like solders 13 and 16. When the paste-like solder 13 is melted, the paste-like solder 17 is already melted. Thus, the melted paste-like solder 13 is guided by the melted paste-like solder 17 to rapidly flow toward the lead terminal 15.

Figure 8:
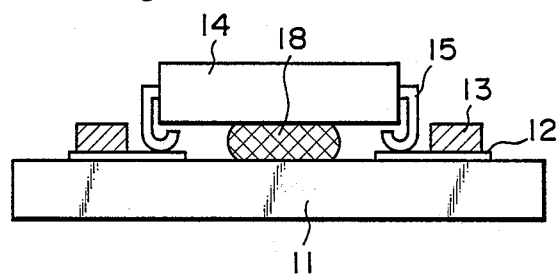
FIGS. 8 and 9 are schematic explanatory views showing still another example of means for holding electronic component at predetermined positions on a substrate.
Figure 9:
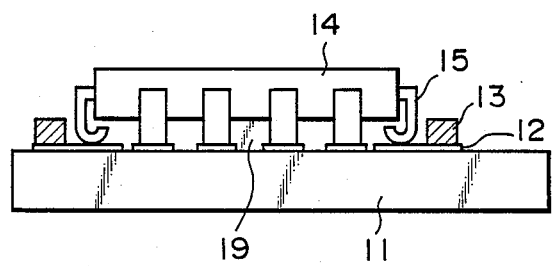

As a retainer for holding the electronic components 14 at a predetermined position in FIG. 8, a bonding agent 18 is disposed between the substrate 11 and the lower portion of the electronic component 14 instead of the paste-like solder 16 contacted ith the lead terminals 15, the electronic component 14 body can be secured by the bonding strength of the bonding agent. Further, as shown in FIG. 9, a projection 19 is formed between the two adjacent pads 12 and 12 on the surface 11, and the two lead terminals 15, 15 of the electronic component 14 are contacted with both sides of the projection 19 to hold the electronic component 14 on the substrate 11. When the soldering method of the present invention is executed, the retainer for holding the electronic component 14 on the substrate 11 is not limited to that described above, but may be means for holding the electronic component 14 until the paste-like solder 13 is melted to flow toward the head terminals 15 so that the melted solder is adhered to the lead terminals 15 to form a suitable fillet.

What is claimed is:

1. A soldering method for connecting by soldering a plurality of lead terminals of an electronic component to conductive terminal connecting portions disposed corresponding to the lead terminals of a substrate, comprising the steps of:

coating each of said terminal connecting portions with connecting paste-like solders corresponding to the lead terminals, holding each of the lead terminals from each electronic component at positions separated from the corresponding paste-like solders, and thereafter moving said substrate into a heating atmosphere and melting the paste-like solders, thereby causing the melted paste-like solders to flow from the separate positions on the terminal connecting portions toward the corresponding lead terminals for contacting with the corresponding lead terminals to form a solder fillet between each of the lead terminals and the corresponding terminal connecting portions.

2. A soldering method for connecting by soldering a plurality of lead terminals of an electronic component to conductive terminal connecting portions disposed corresponding to the lead terminals on a substrate, comprising the steps of:

coating each of said terminal connecting portions with a pair of paste-like solders at separated positions corresponding to the lead terminals, placing each of the lead terminals in contact with a respective one of the pair of paste-like solders, and thereafter moving said substrate into a heating atmosphere and melting the pair of paste-like solders, thereby allowing the other paste-like solder separated from the one paste-like solder in contact with the lead terminal of the pair of melted paste-like solders to flow on the terminal connecting portions until contacting with the one paste-like solder.

3. A soldering method according to claim 2, wherein said coating step is a single printing process with the same material forming the pair of paste-like solders.

4. A soldering method for soldering a plurality of lead terminals of an electronic component to corresponding connecting pads on a substrate by melting the solder within a furnace wherein there is a difference in thermal capacity between the leads and the pads such that the leads reach the solder melting temperature prior to the connecting pads reaching the solder melting temerature, comprising the steps of:

coating each of said connecting pads respectively with paste-like solder at a position spaced from and adjacent corresponding leads;

holding the electronic component so that each lead terminal is spaced from the corresponding paste-like solder;

thermally separating said paste-like solder of each said pad from the adjacent corresponding lead sufficiently that each paste-like solder will completely melt only after its supporting pad reaches the solder melting temperature;

providing a heating atmosphere sufficient to first raise the temperature to the leads to the solder melting temperature and second as a result of the difference in thermal capacity between the leads and the pads raise the temperature of the connecting pads to the solder melting temperature, thus completely melting the paste-like solder and causing the melted solder to flow along the connecting pads into contact with the adjacent corresponding leads to form a solder fillet therebetween; and removing the electrical component and substrate from the heating atmosphere and cooling sufficiently to solidify the solder fillet formed between each lead and connecting pad.

5. The soldering method according to claim 4, wherein said step of holding includes providing a bonding agent between the body of the electronic component and the substrate that is separate and spaced from the connecting pads, leads and paste-like solder.

6. The method according to claim 4 wherein said step of holding includes providing a projection from the substrate to engage adjacent leads.

7. The method according to claim 4, wherein said step of holding includes providing a plurality of second paste-like solders between each lead and its adjacent connecting pad so that the second paste-like solder viscously holds the lead and is thermally separated from the first mentioned paste-like solder.

8. The method of claim 7, further including connecting solder of substantially less thickness than said first and second paste-like solders between adjacent pairs of said first and second paste-like solders.

* * * * *